(12) United States Patent
Nevers et al.

(10) Patent No.: US 10,720,428 B2
(45) Date of Patent: Jul. 21, 2020

(54) HIGH BANDGAP SCHOTTKY CONTACT LAYER DEVICE

(71) Applicant: Qorvo US, Inc., Greensboro, NC (US)

(72) Inventors: Corey A. Nevers, Hillsboro, OR (US); Sheila K. Hurtt, Portland, OR (US)

(73) Assignee: Qorvo US, Inc., Greensboro, NC (US)

( * ) Notice: Subject to any disclaimer, the term of this patent is extended or adjusted under 35 U.S.C. 154(b) by 5 days.

(21) Appl. No.: 15/277,054

(22) Filed: Sep. 27, 2016

(65) Prior Publication Data

US 2017/0133368 A1    May 11, 2017

Related U.S. Application Data

(60) Provisional application No. 62/253,444, filed on Nov. 10, 2015.

(51) Int. Cl.

| | |
|---|---|
| *H01L 21/8252* | (2006.01) |
| *H01L 29/778* | (2006.01) |
| *H01L 27/06* | (2006.01) |
| *H01L 29/66* | (2006.01) |
| *H01L 27/095* | (2006.01) |
| *H01L 29/423* | (2006.01) |
| *H01L 27/088* | (2006.01) |
| *H01L 29/06* | (2006.01) |

(52) U.S. Cl.
CPC ...... *H01L 27/0883* (2013.01); *H01L 21/8252* (2013.01); *H01L 27/0605* (2013.01); *H01L 27/095* (2013.01); *H01L 29/66462* (2013.01); *H01L 29/7785* (2013.01); *H01L 29/0657* (2013.01); *H01L 29/42316* (2013.01)

(58) Field of Classification Search
CPC ............ H01L 27/0883; H01L 27/0605; H01L 27/095; H01L 27/475; H01L 29/66462; H01L 29/7785
See application file for complete search history.

(56) References Cited

U.S. PATENT DOCUMENTS

| | | | | |
|---|---|---|---|---|
| 4,943,540 | A | * | 7/1990 | Ren .................. H01L 21/30612 148/DIG. 51 |
| 5,514,605 | A | * | 5/1996 | Asai .................. H01L 21/8252 257/E21.697 |
| 5,606,184 | A | * | 2/1997 | Abrokwah ........ H01L 21/28575 257/192 |
| 5,945,695 | A | | 8/1999 | Takikawa |
| 7,321,132 | B2 | | 1/2008 | Robinson et al. |

(Continued)

*Primary Examiner* — Matthew C Landau
*Assistant Examiner* — Mark Hatzilambrou
(74) *Attorney, Agent, or Firm* — Withrow & Terranova, P.L.L.C.

(57) ABSTRACT

A high bandgap Schottky contact layer device and methods for producing same are provided herein. According to one aspect, a high bandgap Schottky contact layer device comprises a substrate, a first Schottky layer over the substrate, the first Schottky layer having a first bandgap, and a second Schottky layer over the first Schottky layer, the second Schottky layer having a second bandgap. The device further comprises a first metal contact over the second Schottky layer and at least one ohmic contact, a portion of which being in direct contact with the substrate. The first bandgap is greater than 1.7 electronvolts (eV). In one embodiment, the second bandgap is also greater than 1.7 eV.

19 Claims, 6 Drawing Sheets

(56) References Cited

U.S. PATENT DOCUMENTS

| | | | |
|---|---|---|---|
| 2002/0171076 A1* | 11/2002 | Danzilio | H01L 27/0605 |
| | | | 257/12 |
| 2006/0208279 A1* | 9/2006 | Robinson | H01L 29/66462 |
| | | | 257/194 |
| 2007/0052048 A1 | 3/2007 | Hoke | |
| 2007/0278519 A1* | 12/2007 | Baudet | H01L 21/8252 |
| | | | 257/192 |
| 2007/0278523 A1* | 12/2007 | Lin | H01L 21/8252 |
| | | | 257/194 |
| 2010/0270591 A1* | 10/2010 | Ahn | H01L 29/7782 |
| | | | 257/194 |
| 2011/0147798 A1* | 6/2011 | Radosavljevic | H01L 21/2256 |
| | | | 257/194 |
| 2013/0062667 A1* | 3/2013 | Chini | H01L 21/8252 |
| | | | 257/195 |
| 2014/0116500 A1* | 5/2014 | Stan | H01L 31/1844 |
| | | | 136/255 |

* cited by examiner

HIGH BANDGAP SCHOTTKY CONTACT LAYER DEVICE

RELATED APPLICATIONS

This application claims the benefit of provisional patent application No. 62/253,444, filed Nov. 10, 2015, the disclosure of which is hereby incorporated herein by reference in its entirety.

FIELD OF DISCLOSURE

The present disclosure relates to the design, fabrication, and use of improved-performance Pseudomorphic High Electron Mobility Transistor (pHEMT) devices.

BACKGROUND

Pseudomorphic High Electron Mobility (pHEMT) devices, including Enhancement and Depletion mode Field-Effect Transistors (EFETs and DFETs, respectively), are used in applications, such as Power Amplifiers (PAs) and Low-Noise Amplifiers (LNAs), where device linearity is highly desired. Generally, performance of EFET and DFET designs is limited.

SUMMARY

The present disclosure relates to an improvement in existing Pseudomorphic High Electron Mobility Transistor (pHEMT) device performance and architecture. The present disclosure addresses performance improvement as relating to Enhancement or Depletion mode Field-Effect Transistors (EFETs and DFETs), which are used in highly linear applications such as Power Amplifiers (PAs) and Low-Noise Amplifiers (LNAs). Recognizing that EFETs are heavily used for LNAs, the present disclosure addresses improving device linearity through manipulating the Schottky layer band gap.

Generally, performance is limited by the materials used to make the transistor, specifically, the metal used to form the gate contact and the material with which the gate is in contact (Schottky contact layer). The present disclosure relates to a high bandgap layer which the gate metal contacts, forming the Schottky contact, defined as a contact having Schottky diode characteristics. If, for example, Aluminum Gallium Indium Phosphide (AlGaInP) is used in place of a common material, Aluminum Gallium Arsenide (AlGaAs), for example, then the fundamental device properties are altered, allowing for more linear circuit performance.

According to one aspect, a high bandgap Schottky contact layer device comprises: a substrate; a first Schottky layer formed over the substrate, the first Schottky layer having a first bandgap; and a second Schottky layer formed over the first Schottky layer, the second Schottky layer having a second bandgap, wherein the first bandgap is greater than 1.7 electronvolts (eV).

In one embodiment, the substrate comprises Gallium Arsenide (GaAs). In one embodiment, the substrate has a bandgap of less than or equal to 1.7 eV.

In one embodiment, the first Schottky layer comprises at least one of Aluminum Gallium Arsenide (AlGaAs), Indium Gallium Phosphide (InGaP), Aluminum Indium Phosphide (AlInP), Aluminum Gallium Indium Phosphide (AlGaInP), and Aluminum Arsenide (AlAs).

In one embodiment, the second Schottky layer comprises at least one of Gallium Arsenide (GaAs) and Aluminum Gallium Arsenide (AlGaAs).

In one embodiment, the second bandgap is less than or equal to 1.7 eV. In one embodiment, the second bandgap is greater than 1.7 eV.

In one embodiment, the device further comprises a first metal contact formed over the second Schottky layer to form a Schottky contact, e.g., a junction that behaves as a Schottky diode; and at least one ohmic contact, a portion of which being in direct contact with the substrate. In one embodiment, the second bandgap is less than or equal to 1.7 eV. In one embodiment, the second bandgap is greater than 1.7 eV. When the first metal contact forms a gate of a FET device, the first metal contact may also be referred to as a "gate metal contact," "a gate contact," or simply "gate metal."

In one embodiment, a portion of the first metal contact is in direct contact with the first Schottky layer. In one embodiment, a portion of the first metal contact is in direct contact with the second Schottky layer but not the first Schottky layer. The first gate metal deposited may be a refractory metal, typically including Tungsten (W), Titanium (Ti), or alloys with W and Ti, or metals with a high work function to GaAs, AlGaAs, or AlGaInP, such as Aluminum (Al), Platinum (Pt), Gold (Au), and their alloys. As used herein, the term "refractory metal" refers to a group of metal elements having exceptionally high melting points, such as Niobium (Nb), Molybdenum (Mo), Tantalum (Ta), Rhenium (Re), Vanadium (V), Chromium (Cr), Zirconium (Zr), Hafnium (Hf), Ruthenium (Ru), Rhodium (Rh), Osmium (Os), and Iridium (Ir) in addition to W and Ti mentioned above. In one embodiment, the first metal contact comprises an etched or diffused contact. In one embodiment, the first metal contact comprises a recessed contact through the second Schottky layer. In one embodiment, the first metal contact comprises a recessed contact through the second Schottky layer and into the first Schottky layer.

In one embodiment, the at least one ohmic contact comprises a diffused contact through the first Schottky layer. In one embodiment, the at least one ohmic contact comprises a diffused contact through the first and second Schottky layers. In one embodiment, the at least one ohmic contact comprises a recessed contact through the first Schottky layer. In one embodiment, the at least one ohmic contact comprises a recessed contact through the first and second Schottky layers.

In one embodiment, the device further comprises a channel layer disposed below the first Schottky layer. In one embodiment, the channel layer comprises a quantum well channel. In one embodiment, the channel layer comprises Indium Gallium Arsenide (InGaAs). In one embodiment, the device further comprises a first spacer layer below the channel layer and above the substrate and a second spacer layer above the channel layer and below the first Schottky layer. In one embodiment, at least one of the first spacer layer and the second spacer layer comprises Aluminum Gallium Arsenide (AlGaAs).

According to another aspect, a method for producing a high bandgap Schottky contact layer device comprises: providing a substrate; forming, over the substrate, a first Schottky layer having a first bandgap; forming, over the first Schottky layer, a second Schottky layer having a second bandgap; forming a first metal contact over the second Schottky layer, a portion of the first metal contact being in direct contact with the first Schottky layer; and forming at least one ohmic contact, a portion of which being in direct contact with the substrate, wherein the first bandgap is greater than 1.7 eV.

According to yet another aspect, a high bandgap Schottky contact layer device comprises: a substrate; a first Schottky layer formed over the substrate, the first Schottky layer having a first bandgap that is greater than 1.7 eV; a second Schottky layer formed over the first Schottky layer, the second Schottky layer having a second bandgap; a first metal contact formed over the second Schottky layer, a portion of the first metal contact being in direct contact with the first Schottky layer; and a first and second ohmic contact, a portion of each being in direct contact with the substrate, wherein the first metal contact forms a gate of an EFET, the first ohmic contact forms a source of the EFET, and the second ohmic contact forms a drain of the EFET.

According to yet another aspect, a high bandgap Schottky contact layer device comprises: a substrate; a first Schottky layer formed over the substrate, the first Schottky layer having a first bandgap that is greater than 1.7 eV; a second Schottky layer formed over the first Schottky layer, the second Schottky layer having a second bandgap; a first metal contact formed over the second Schottky layer, a portion of the first metal contact being in direct contact with the second Schottky layer but not the first Schottky layer; and a first and second ohmic contact, a portion of each being in direct contact with the substrate, wherein the first metal contact forms a gate of a DFET, the first ohmic contact forms a source of the DFET, and the second ohmic contact forms a drain of the DFET.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
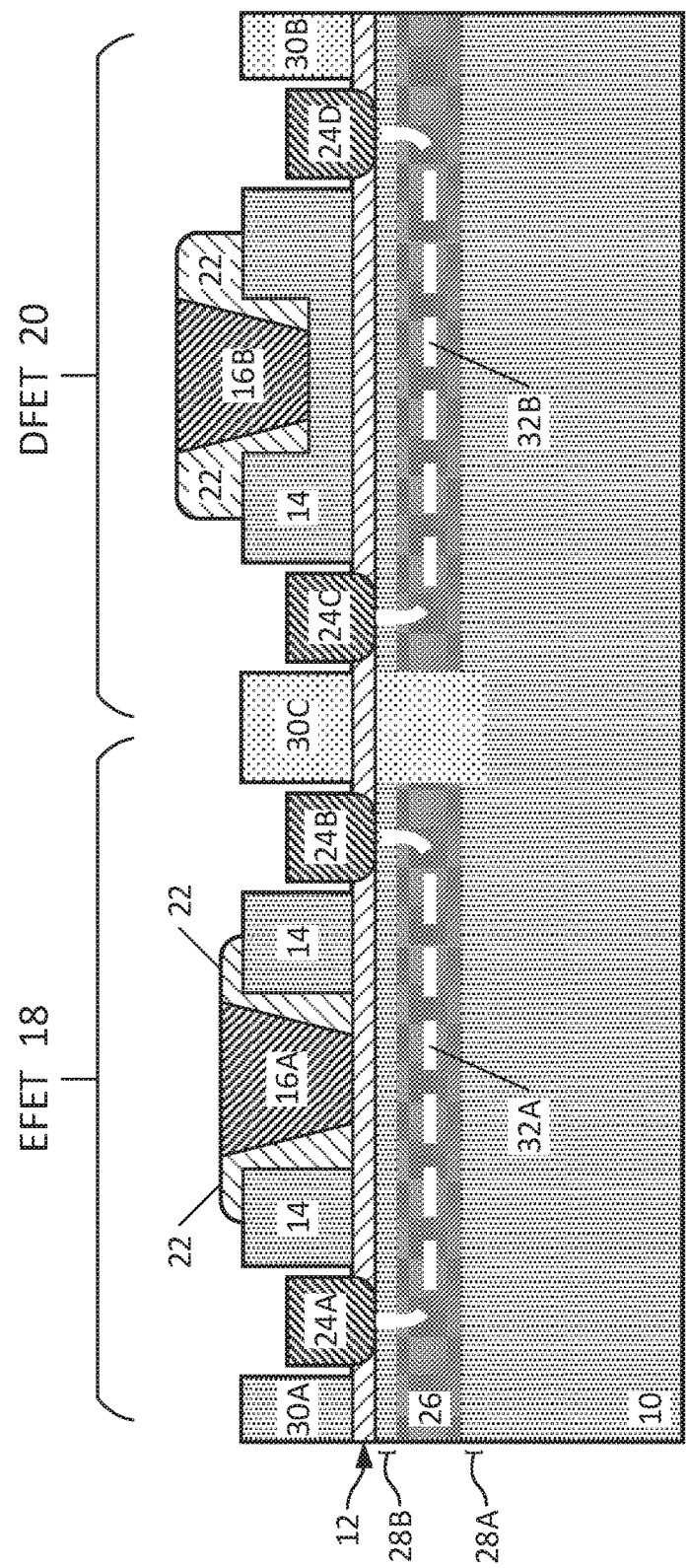
FIG. 1 illustrates an exemplary high bandgap Schottky contact layer device according to an embodiment of the subject matter described herein.

The present disclosure contains modified epitaxial layers that include a high bandgap material within the Schottky layer of the device structure. The high bandgap material could be Aluminum Indium Phosphide (AlInP), Indium Gallium Phosphide (InGaP), Aluminum Gallium Indium Phosphide ([AlxGa1-x]InP), Aluminum Arsenide (AlAs), or Aluminum Gallium Arsenide (AlGaAs) and would be nominally lattice matched to Gallium Arsenide (GaAs) substrates. The material must have both a higher bandgap than GaAs and provide high etch selectivity with GaAs under either wet or dry etch conditions.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates an exemplary high bandgap Schottky contact layer device according to an embodiment of the subject matter described herein. In the embodiment illustrated in FIG. 1, the high bandgap Schottky contact layer device comprises a substrate 10, typically comprising Gallium Arsenide (GaAs), but other materials are also contemplated. In one embodiment, the substrate has a bandgap of less than or equal to 1.7 eV.

In the embodiment illustrated in FIG. 1, a first Schottky layer 12 having a first bandgap is disposed over the substrate 10. In one embodiment, the first Schottky layer 12 may comprise at least one of Aluminum Gallium Arsenide (AlGaAs), Indium Gallium Phosphide (InGaP), Aluminum Indium Phosphide (AlInP), Aluminum Gallium Indium Phosphide (AlGaInP), and Aluminum Arsenide (AlAs). In one embodiment, the first bandgap is greater than 1.7 eV. A Schottky layer having a bandgap of greater than 1.7 eV is referred to herein as a "high bandgap" layer. For comparison, a "normal bandgap" Schottky layer is typically formed from 22-24% AlGaAs with a nominal bandgap of approximately 1.7 eV. In contrast, AlGaInP bandgaps vary from 1.85 to 2.15 eV. Since this range is above 1.7 eV, AlGaInP bandgaps are considered "high bandgaps."

In the embodiment illustrated in FIG. 1, a second Schottky layer 14 having a second bandgap is disposed over the first Schottky layer 12. In one embodiment, the second Schottky layer 14 may comprise at least one of Gallium Arsenide (GaAs) and Aluminum Gallium Arsenide (AlGaAs).

In one embodiment, the second bandgap is less than or equal to 1.7 eV, forming a "low-bandgap" Schottky layer 14 over the "high bandgap" Schottky layer 12.

In one embodiment, the second bandgap is greater than 1.7 eV, forming a "high bandgap" Schottky layer 14 over the "high bandgap" Schottky layer 12. In these embodiments, the two "high bandgap" Schottky layers may have the same or different high bandgap values. Where the two high bandgap values are the same, the first Schottky layer 12 and the second Schottky layer 14 may be created separately or at the same time.

In the embodiment illustrated in FIG. 1, a first metal contact 16A and 16B, sometimes referred to herein as "first metal contact 16," is disposed over the second Schottky layer 14. In one embodiment, a portion of the first metal contact 16, such as first metal contact 16A in FIG. 1, is in direct contact with the first Schottky layer 12. This configuration may be used to create an Enhancement Field-Effect Transistor (EFET) 18. In another embodiment, a portion of the first metal contact 16, such as first metal contact 16B in FIG. 1, is in direct contact with the second Schottky layer 14 but not the first Schottky layer 12. This configuration may be used to create a Depletion Field-Effect Transistor (DFET) 20.

In one embodiment, the first metal contact 16 comprises a refractory metal. In one embodiment, the refractory metal comprises at least one of Niobium (Nb), Molybdenum (Mo), Tantalum (Ta), Tungsten (W), Rhenium (Re), Titanium (Ti), Vanadium (V), Chromium (Cr), Zirconium (Zr), Hafnium (Hf), Ruthenium (Ru), Rhodium (Rh), Osmium (Os), and Iridium (Ir).

In one embodiment, the first metal contact 16 comprises an etched or diffused contact. In one embodiment, the first metal contact 16 comprises a recessed contact through the second Schottky layer 14. In another embodiment, the first metal contact 16 comprises a recessed contact through the second Schottky layer 14 and into the first Schottky layer 12. In the embodiment illustrated in FIG. 1, the first metal contact 16 is located within a passivation layer 22 that reduces the area of the footprint of the first metal contact 16 (i.e., the portion of the first metal contact 16 that touches the first Schottky layer 12), although this is not required.

In the embodiment illustrated in FIG. 1, at least one of ohmic contacts 24A through 24D, sometimes referred to herein as "ohmic contact 24" is present, a portion of which is in direct contact with the substrate 10. In one embodiment, the ohmic contact 24 comprises a diffused contact through the first Schottky layer 12. In another embodiment, the ohmic contact 24 comprises a diffused contact through the first Schottky layer 12 and the second Schottky layer 14. In one embodiment, the ohmic contact 24 may be a recessed contact. In one embodiment, the ohmic contact 24 may be a diffused contact.

In one embodiment, the device further comprises a channel layer 26 disposed below the first Schottky layer 12. In one embodiment, the channel layer comprises a quantum well channel. In one embodiment, the channel layer comprises Indium Gallium Arsenide (InGaAs). In one embodiment, the device further comprises a first spacer layer 28A below the channel layer 26 and above the substrate and a second spacer layer 28B above the channel layer 26 and below the first Schottky layer 12. In one embodiment, at least one of the first spacer layer 28A and the second spacer layer 28B comprises Aluminum Gallium Arsenide (AlGaAs).

In the embodiment illustrated in FIG. 1, the EFET 18 and DFET 20 are separated by one of isolation structures 30A though 30C, sometimes referred to herein as "isolation structure 30." In one embodiment, the isolation structure comprises the second Schottky layer 14 (e.g., the isolation structure 30A). In another embodiment, the isolation structure comprises material distinct from the second Schottky layer 14 (e.g., the isolation structure 30B). In one embodiment, the isolation structure 30 may comprise an isolation implant structure that extends into the substrate 10 and also through the channel layer 26, if extant (e.g., the isolation structure 30C). The path of the conduction channels 32A and 32B are shown as white dashed lines through the channel layer(s) 26.

The high bandgap Schottky contact layer device described herein provides distinct advantages over conventional devices. The high bandgap material used as the Schottky contact increases linearity by increasing the range of voltages within which an amplifier input signal can swing and still remain in the linear portion of the amplifier's operation. In addition, the ohmic contact(s) 24 can be sunken contacts, terminating in the high bandgap Schottky layer rather than a highly doped contact layer many layers above the channel, which simplifies manufacturing by eliminating the need for the highly doped ohmic contact layer. The ohmic contact 24 may be either physically recessed into the Schottky layer stack and then diffused into lower layers or simply diffused through the Schottky layer stack from layers above. These two features make it possible to form a single gate or dual gate recess with a single gate metal deposition procedure (potentially refractory) for both enhancement-type gates and depletion-type gates simultaneously, formed by either a diffused or recessed gate contact, which further simplifies manufacturing.

Figure 2:
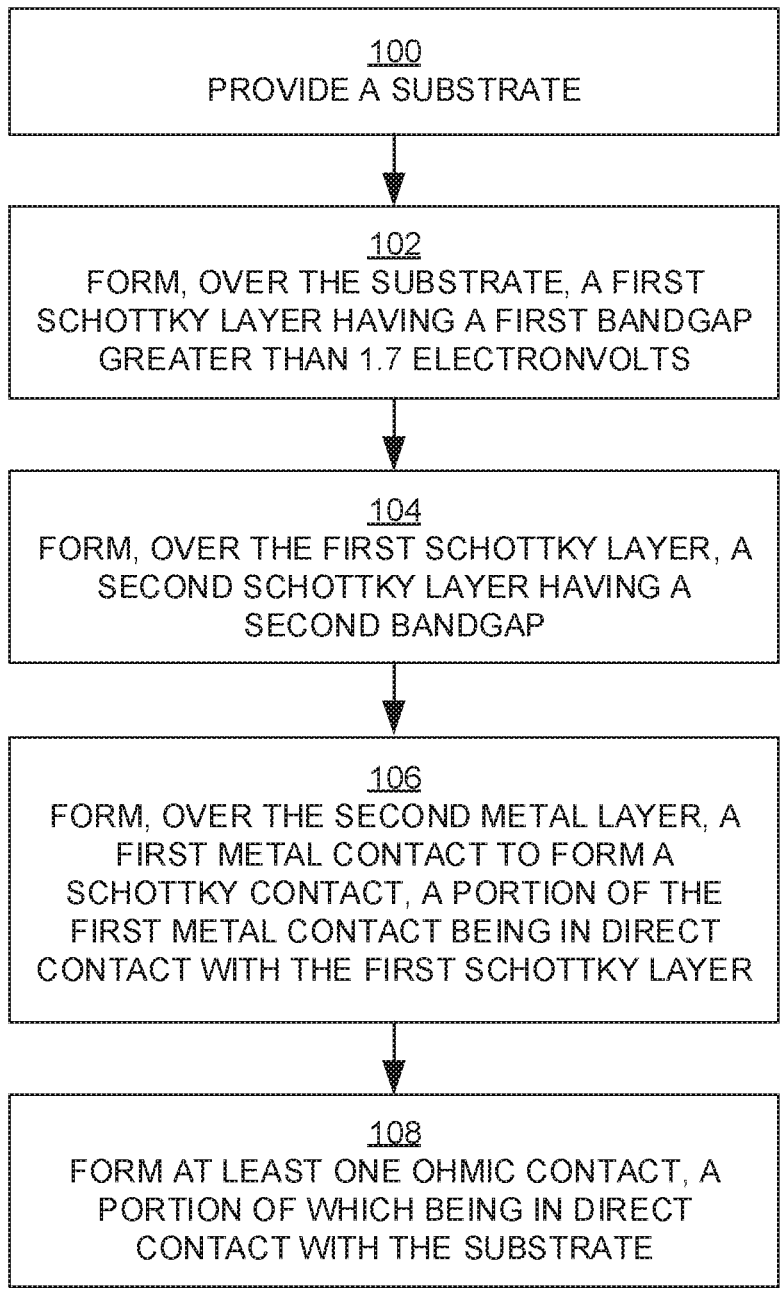
FIG. 2 illustrates an exemplary process for providing a high bandgap Schottky contact layer device according to an embodiment of the subject matter described herein.

FIG. 2 illustrates an exemplary process for providing a high bandgap Schottky contact layer device according to an embodiment of the subject matter described herein. In the embodiment illustrated in FIG. 2, the method includes providing a substrate (step 100), forming, over the substrate, a first Schottky layer having a first bandgap greater than 1.7 eV (step 102), and forming, over the first Schottky layer, a second Schottky layer having a second bandgap (step 104). In one embodiment, the process further includes forming a first metal contact over the second Schottky layer, a portion of the first metal contact being in direct contact with the first Schottky layer (step 106), and forming at least one ohmic contact, a portion of which being in direct contact with the substrate (step 108).

The steps described above may be used to produce an EFET device. In an alternative embodiment, the first metal contact is formed over the second Schottky layer but does not extend so far down as to contact the first Schottky layer; such a configuration may be used to produce a DFET device.

In one embodiment, the substrate comprises Gallium Arsenide (GaAs). In one embodiment, the substrate has a bandgap of less than or equal to 1.7 eV.

In one embodiment, the first Schottky layer may comprise at least one of Aluminum Gallium Arsenide (AlGaAs), Indium Gallium Phosphide (InGaP), Aluminum Indium Phosphide (AlInP), Aluminum Gallium Indium Phosphide (AlGaInP), and Aluminum Arsenide (AlAs).

In one embodiment, the second Schottky layer may comprise at least one of Gallium Arsenide (GaAs) and Aluminum Gallium Arsenide (AlGaAs). In one embodiment, the second bandgap is less than or equal to 1.7 eV, forming a "low-bandgap" second Schottky layer over the "high bandgap" first Schottky layer. In another embodiment, the second bandgap is greater than 1.7 eV, forming a "high bandgap" second Schottky layer over the "high bandgap" first Schottky layer. In these embodiments, the two "high bandgap" Schottky layers may have the same or different high bandgap values. Where the two high bandgap values are the same, the first Schottky layer and the second Schottky layer may be created separately or at the same time.

In one embodiment, a portion of the first metal contact is in direct contact with the first Schottky layer. This configuration may be used to create EFET. In another embodiment, a portion of the first metal contact is in direct contact with the second Schottky layer but not the first Schottky layer. This configuration may be used to create a DFET. In one embodiment, the first metal contact comprises a refractory metal. In one embodiment, the refractory metal comprises at least one of Niobium (Nb), Molybdenum (Mo), Tantalum (Ta), Tungsten (W), Rhenium (Re), Titanium (Ti), Vanadium (V), Chromium (Cr), Zirconium (Zr), Hafnium (Hf), Ruthenium (Ru), Rhodium (Rh), Osmium (Os), and Iridium (Ir). In one embodiment, the first metal contact comprises an etched or diffused contact. In one embodiment, the first metal contact comprises a recessed contact through the second Schottky layer. In another embodiment, the first metal contact comprises a recessed contact through the second Schottky layer and into the first Schottky layer. In one embodiment, the first metal contact is located within a passivation layer that reduces the area of the footprint of the first metal contact.

In one embodiment, the ohmic contact comprises a diffused contact through the first Schottky layer. In another embodiment, the ohmic contact comprises a diffused contact through the first Schottky layer and the second Schottky layer. In one embodiment, the ohmic contact may be a recessed contact. In one embodiment, the ohmic contact may be a diffused contact.

In one embodiment, providing a substrate comprises providing a substrate that includes a channel layer disposed below the first Schottky layer. In one embodiment, the channel layer comprises a quantum well channel. In one embodiment, the channel layer comprises Iridium Gallium Arsenide (InGaAs). In one embodiment, the channel layer is disposed between spacer layers above and below the channel layer. In one embodiment, at least one of the first spacer layers comprises Aluminum Gallium Arsenide (AlGaAs).

In one embodiment, isolation structures may be used to electrically and/or thermally isolate devices constructed using the methods described above. In one embodiment, the isolation structure comprises a portion of the second Schottky layer. In another embodiment, the isolation structure comprises material distinct from the second Schottky layer. In one embodiment, the isolation structure may comprise an isolation implant structure that extends into the substrate and also through the channel layer and buffer layers, if extant.

According to another aspect, a high bandgap Schottky contact layer device comprises: a substrate; a first Schottky layer formed over the substrate, the first Schottky layer having a first bandgap that is greater than 1.7 eV; and a second Schottky layer formed over the first Schottky layer, the second Schottky layer having a second bandgap. The device further comprises a first metal contact formed over the second Schottky layer, a portion of the first metal contact being in direct contact with the first Schottky layer. The device further comprises a first ohmic contact and a second ohmic contact, a portion of each being in direct contact with the substrate. The first metal contact forms a gate of an EFET, the first ohmic contact forms a source of the EFET, and the second ohmic contact forms a drain of the EFET. Alternatively, the first ohmic contact and second ohmic contact may form the drain and source, respectively, of the EFET.

According to yet another aspect, a high bandgap Schottky contact layer device comprises: a substrate; a first Schottky layer formed over the substrate, the first Schottky layer having a first bandgap that is greater than 1.7 eV; and a second Schottky layer formed over the first Schottky layer, the second Schottky layer having a second bandgap. The device further comprises a first metal contact formed over the second Schottky layer, a portion of the first metal contact being in direct contact with the second Schottky layer but not the first Schottky layer. The device further comprises a first ohmic contact and second ohmic contact, a portion of each being in direct contact with the substrate. The first metal contact forms a gate of a DFET, the first ohmic contact forms a drain of the DFET, and the second ohmic contact forms a source of the DFET. Alternatively, the first ohmic contact and second ohmic contact may form the source and drain, respectively, of the DFET.

FIGS. 3 through 10 show a simplified wafer process that may be used to produce a high bandgap Schottky contact layer device according to an embodiment of the subject matter described herein. The wafer cross-sections illustrated in FIGS. 3 through 10 show the result of various steps, each of which may include multiple sub-steps, such as the addition, use, and removal of intermediate substances or structures (such as photolithography or ion implant mask layers, for example) as well as surface preparation steps (such as wet-etch and planarization steps, for example), which are not shown in the simplified wafer process for brevity.

Figure 3:
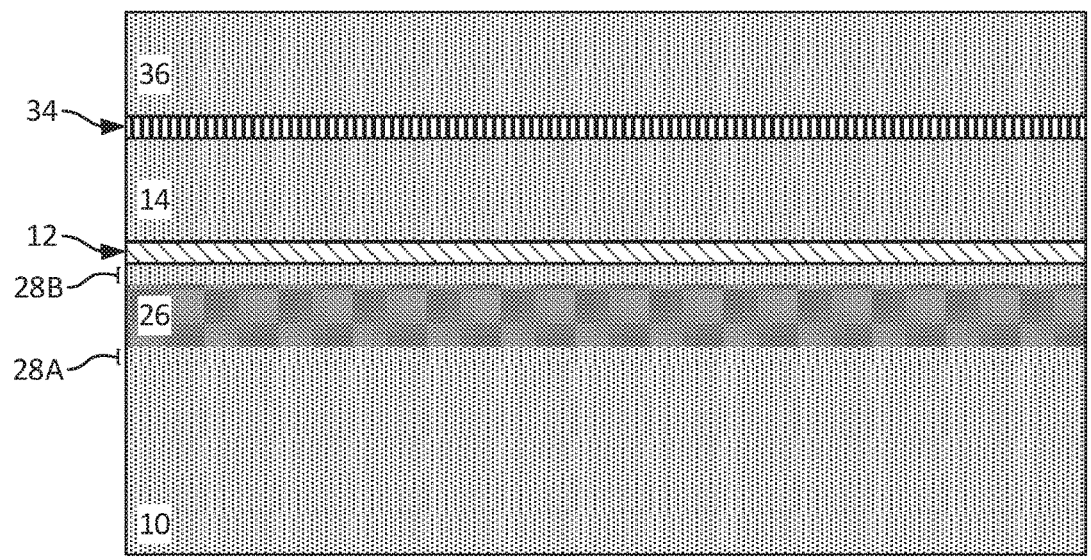
FIG. 3 shows a simplified wafer stack prior to the first step in the simplified process flow.

FIG. 3 shows a simplified wafer stack prior to the first step in the simplified process flow. The simplified wafer stack illustrated in FIG. 3 includes the substrate 10, which may also be referred to as a buffer layer, which optionally includes the channel layer 26 along with the spacer layers 28A and 28B.

The first Schottky layer 12 having a first bandgap value is disposed above the substrate 10. The first Schottky layer 12 is a high bandgap layer, having a first bandgap of greater than 1.7 eV. In one embodiment, the first bandgap is greater than 1.8 eV. In one embodiment, the first bandgap is greater than 1.85 eV. In one embodiment, the first bandgap is in the range from 1.85 eV to 2.15 eV.

The second Schottky layer 14 having a second bandgap value is disposed above the first Schottky layer 12. In one embodiment, the second Schottky layer 14 is also a high bandgap layer, in which case the second bandgap value may be the same as or different from the first bandgap value. In an alternative embodiment, the second Schottky layer 14 may not be a high bandgap layer, e.g., having a bandgap that is not greater than 1.7 eV.

The simplified wafer stack illustrated in FIG. 3 also includes an etch stop layer 34 and a sacrificial cap 36 (also referred to as "sacrificial layer 36").

TABLE 1

| Layer | Composition | Doping |
| --- | --- | --- |
| Sacrificial cap | GaAs | Any |
| Etch stop | AlGaAs or InGaP | Any |
| Schottky 1 | GaAs or AlGaAs, or both | n− |
| Schottky 2 high bandgap | AlGaAs, InGaP, AlInP, AlGaInP, or AlAs | n |
| n spacer | AlGaAs | n |
| Delta doping | | n++ |
| Spacer | AlGaAs | Undoped |
| Channel | InGaAs | Undoped |
| Spacer | AlGaAs | Undoped |
| Delta doping | | n++ |
| Buffer and substrate | GaAs | Undoped |

Table 1, above, lists example characteristics of the simplified wafer stack illustrated in FIG. 3. Note that the "n spacer" and "Delta doping" layers are not visible in FIG. 3, but are located in the relative positions within the stack as represented in Table 1.

Thus, FIG. 3 shows a simplified epitaxial stack using a high bandgap layer. In the layers above the channel layer 26, which in this embodiment is a standard quantum well channel surrounded by delta doped layers, the first Schottky 12 followed by the second Schottky layer 14 are formed. A gate contact may sit on either the first Schottky layer 12 or the second Schottky layer 14 or both. Either or both of the Schottky layers may be high bandgap layers. A device engineer may decide how to use the layers differently for device integration and performance. Table 2, below lists examples of this. Table 2 is included to aid in the understanding of how the present disclosure may be used in a typical transistor design, including how to create the gate and ohmic contacts.

TABLE 2

| # | $1^{st}$ Schottky layer (12) | $2^{nd}$ Schottky layer (14) | Gate Contact (16) | Ohmic Contact (24) |
| --- | --- | --- | --- | --- |
| 1 | High Bandgap | Standard | Single or dual recess Etched or diffused | Diffused or recessed |
| 2 | High Bandgap | High Bandgap | Single or dual recess Etched or diffused | Diffused or recessed |
| 3 | Standard | High Bandgap | Single or dual recess Etched or diffused | Diffused or recessed |
| 4 | Standard | Standard | Single or dual recess Etched or diffused | Standard |

In one embodiment represented by row 1, the first metal contact 16A, which in this embodiment is an EFET gate contact, is isolated from the second Schottky layer 14 and makes contact only with the high bandgap first Schottky layer 12, while the first metal contact 16B, which in this embodiment is a DFET gate contact, makes contact only with the normal-bandgap second Schottky layer 14.

In one embodiment represented by row 2, the DFET gate contact 16B would make contact only with the high bandgap second Schottky layer 14 and have a high forward voltage drop ($V_F$). The EFET gate contact 16A could be alloyed down or recessed etched into either the high bandgap second Schottky layer 14 only, or deeper, into the high bandgap second Schottky layer 12. The advantage of the former is that $V_F$ would be high, and the advantage of the latter is that there would be low reverse gate leakage. The designer could choose one or the other of these advantages by adjustment of the depth of the gate contact 16. In this embodiment, the first high bandgap Schottky layer 12 and the second high bandgap Schottky layer 14 could have different bandgap values or they could have the same bandgap value; if the same, the first and second Schottky layers could be replaced by a single Schottky layer. The advantage of having a single Schottky layer is that the process is somewhat simplified. The advantage of having two separate high bandgap Schottky layers is that each layer can be of a different composition, which allows the top layer to have etch stop capability while allowing the bottom layer to have a maximum bandgap for $V_F$. Any number of high bandgap Schottky layers may be used, as may intervening non-Schottky layers, although additional layers typically increase the cost of the wafer process and tend to be avoided unless there is a technical advantage to using them. In one embodiment, the total thickness of the combined Schottky layers might need to be tuned due to the higher bandgap of the second Schottky layer 14 for DFETs, especially if the Schottky layer is not doped. In one embodiment, Silicon (Si) doping is used to bring down the device resistance; alternatively, doping may be obviated by sinking the ohmic metals into the channel. In embodiments that use undoped Schottky layers, the effect of bandgap will be exaggerated, which may need to be compensated for via thickness tuning.

In one embodiment, a DFET gate and an EFET gate are essentially identical except for their respective relative distances from the substrate 10 and/or channel 26. In one embodiment, the metal-semiconductor work function may be tuned (e.g., through choice of metals) to the particular bandgap values for each of the two Schottky layers, but this is more easily achieved by tuning of the gate-channel distance (e.g., via the etch depth) of the EFET and DFET gates.

Additionally, with the current production epitaxial stack and processing flow for Pseudomorphic High Electron Mobility Transistors (pHEMTs), the top layer is highly doped and is used for making low-resistance ohmic contacts to the transistor. If the ohmic contacts are recessed by necessity (the high bandgap layer is also high resistance) to make a low-resistance path, then the upper layer of the epitaxial stack need not be used in the formation of ohmic contacts and thus can be sacrificial, or at least doping can be removed to enhance device characteristics.

Figure 4:
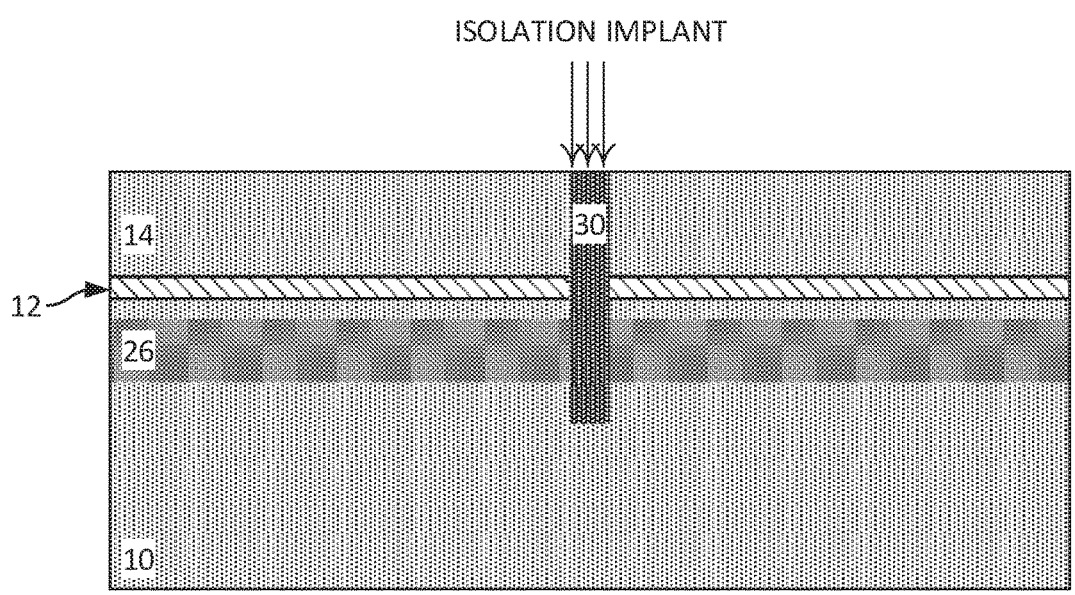
FIG. 4 shows implant isolation and etching of the sacrificial cap layers in Field-Effect Transistor (FET) areas.

FIG. 4 shows implant isolation and etching of the sacrificial cap layers in Field-Effect Transistor (FET) areas. In the embodiment illustrated in FIG. 4, the sacrificial layer 36 and etch stop layer 34 have been removed, and an isolation implant step has been performed to create the isolation structure 30, which may also be referred to as an "isolation implant structure 30."

Figure 5:
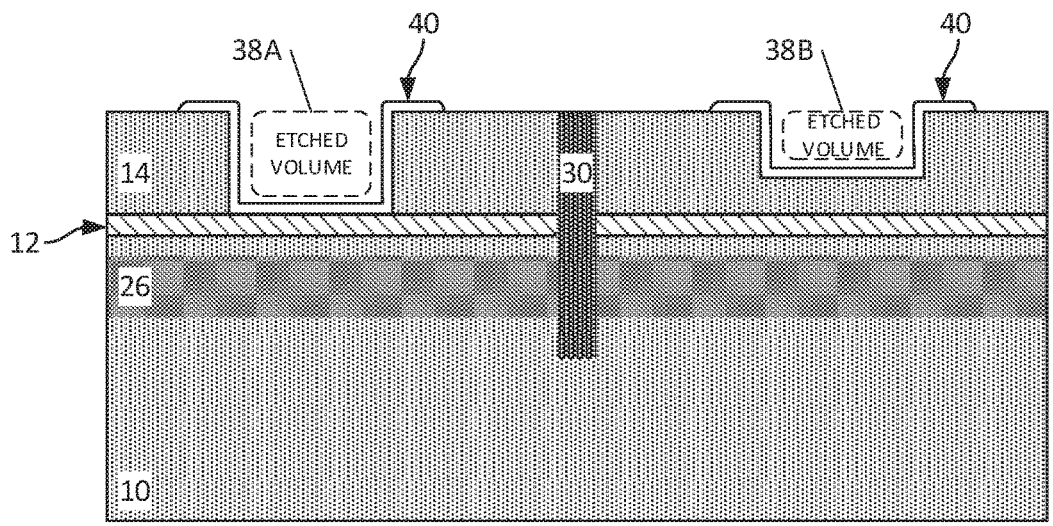
FIG. 5 shows etching and passivation of the E gate recess, which involves etching through the second Schottky layer and terminating on first Schottky (high bandgap) layer, and the D gate recess, which involves etching through the second Schottky layer but not terminating on the first Schottky layer.

FIG. 5 shows etching and passivation of the gate recesses. In the embodiment illustrated in FIG. 5, the etching step etches through the second Schottky layer 14, and, depending on how much of the second Schottky layer 14 is etched away—i.e., how deep the etched volume goes—the resulting device may be an EFET or a DFET. In the embodiment illustrated in FIG. 5, etched volume 38A extends all the way through the second Schottky layer 14 to reach the first Schottky layer 12; this structure may be used to create an EFET device. In contrast, etched volume 38B does not extend fully through the second Schottky layer 14, and therefore does not touch the first Schottky layer 12; this structure may be used to create a DFET device. After the etching step is complete in the embodiment illustrated in FIG. 5, a passivation layer 40 is grown, deposited, or otherwise formed over the exposed surfaces of the etched cavities.

Figure 6:
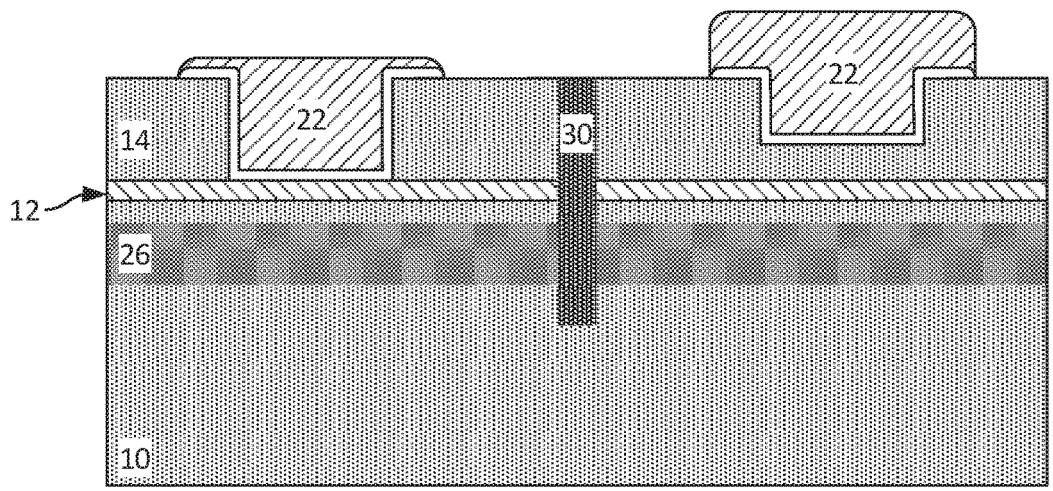
FIG. 6 shows deposition of the passivation material.

FIG. 6 shows deposition of the passivation material. In the embodiment illustrated in FIG. 6, the passivation layer 22 is grown, deposited, or otherwise formed within the cavities of the gate recesses for the purpose of deliberately reducing the footprint of the gate contact metal that is later deposited. If it is not necessary or desired to reduce the footprint of the gate metal contact, the steps represented by FIG. 6 may be skipped.

Figure 7:
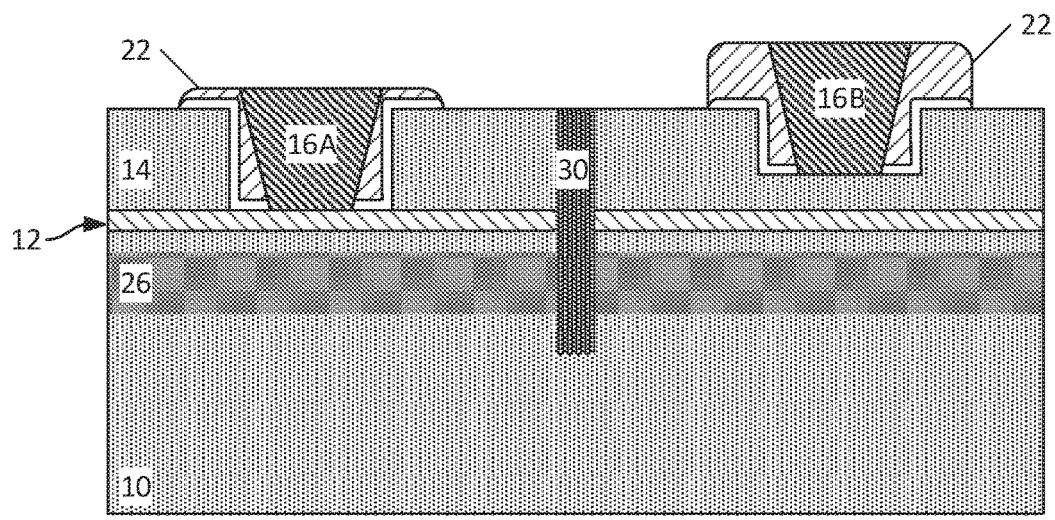
FIG. 7 shows the etch passivation material and deposition of the gate contact in a single or multiple-step process.

FIG. 7 shows the result of etching of the passivation layer 22 and the deposition of the first metal contacts 16A and 16B, which may be a single or multiple-step process. The first metal contact 16A makes contact with the first Schottky layer 12, which creates an EFET, but the first metal contact 16B does not make contact with the first Schottky layer 12, which creates a DFET. Thus, by adjusting the depth that the first metal contact 16 extends through the second Schottky layer 14, both enhancement mode and depletion mode FETs may be fabricated using the same process.

Figure 8:
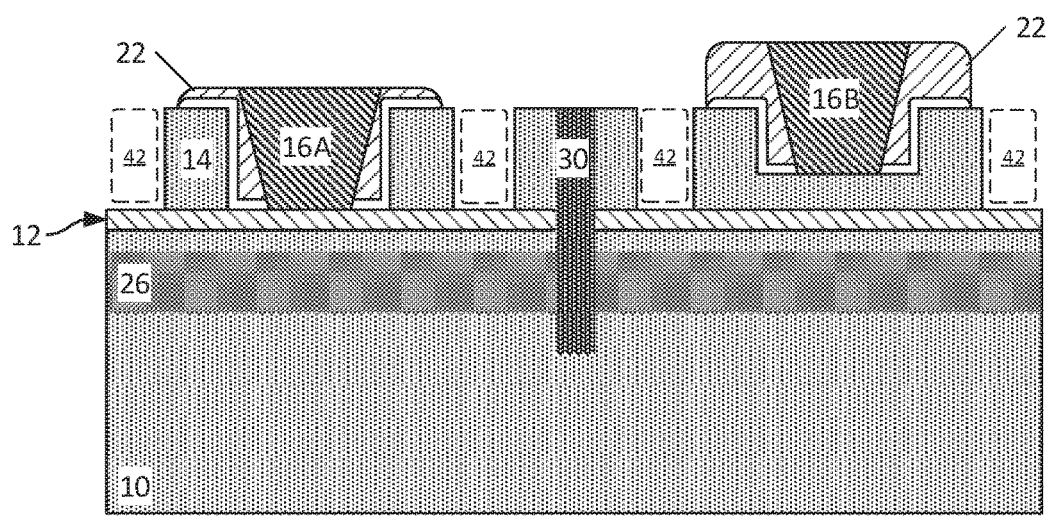
FIG. 8 shows etching to the high bandgap layer in ohmic contact areas, if this is desired.

FIG. 8 shows etching to the high bandgap layer in ohmic contact areas, if this is desired. In the embodiment illustrated in FIG. 8, the second Schottky layer 14 is etched in several locations 42 to expose the first Schottky layer 12 and provide a location for ohmic contacts.

Figure 9:
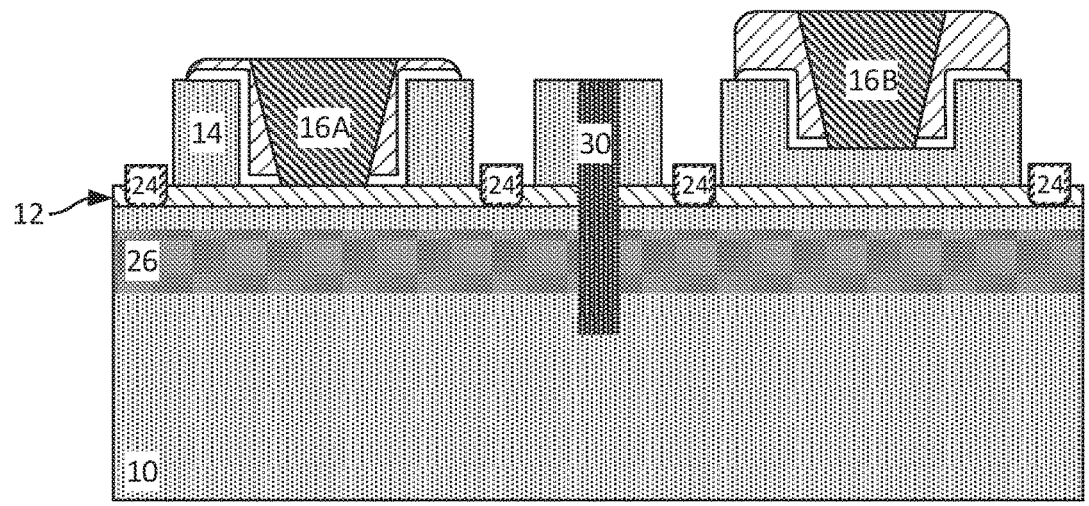
FIG. 9 shows the deposit and alloy ohmic contacts.

FIG. 9 shows the deposit and alloy ohmic contacts. In the embodiment illustrated in FIG. 9, the ohmic contacts 24 extend through the first Schottky layer 12 to make contact (or even extend into) the substrate 10. Such contacts may be diffused, recessed, or both. In one embodiment, the ohmic contact 24 must get past the high bandgap Schottky layer or layers. In one embodiment, there is doping beneath the high bandgap layer. In one embodiment, the sunken ohmic contact will be formed from Germanium (Ge)/Nickel (Ni) or Ge/gold (Au). In one embodiment, the Ge is activated as an n-type (donor) dopant to further reduce contact resistance. The ohmic contact 24 does not have to go so far into the substrate 10 that it touches the channel layer 26, but it likely will. FIG. 9 illustrates an embodiment which uses a recessed contact, but in alternative embodiments, the contact could be diffused to the same depth without using a recess.

It should be noted that in conventional approaches, the ohmic contacts 24 are deposited on the top surface of the epitaxial structure and alloyed into the top portion of the structure. In contrast, in the embodiments of the subject matter described herein, the ohmic contacts bypass the resistive layers above the channel to reach the channel, or at least extend beyond the high bandgap layers into the substrate. In one embodiment, this is achieved by alloying the ohmic metal down to/past the channel. Alternatively, this can be achieved by means of an etched recess. In yet another embodiment, a combination of etched/recessed and diffused ohmic contacts may be formed.

For gate contacts, in one embodiment, the DFET gate recess may be formed and the gate contact deposited without alloying it into the semiconductor. In one embodiment, the EFET gate recess may be formed and then the gate contact is either alloyed into the semiconductor or there can be an additional recess etch step followed by deposition of a non-alloyed contact. In one embodiment, the gate contacts are comprised of a refractory metal while the ohmic contacts are comprised of a non-refractory metal.

Figure 10:
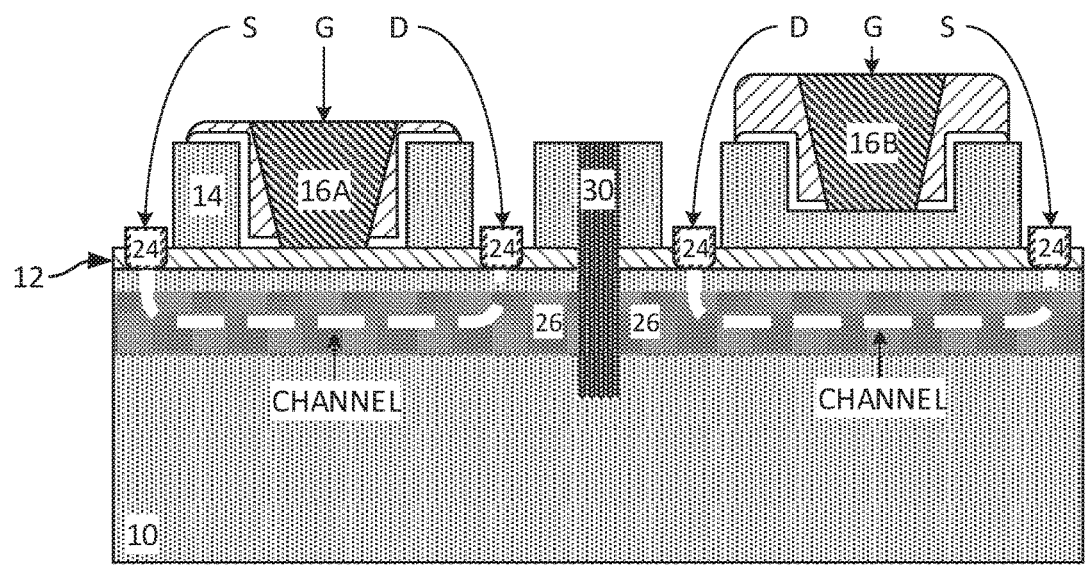
FIG. 10 illustrates an example pair of high bandgap Schottky contact layer devices formed by the wafer process steps described in FIGS. 3 through 9.

FIG. 10 illustrates an example pair of high bandgap Schottky contact layer devices formed by the wafer process steps described above. In the embodiment illustrated in FIG. 10, the first metal contact 16A forms the gate G of an EFET device having a source S and drain D, both of which are ohmic contacts 24. The first metal contact 16B forms the gate G of a DFET device having a source S and drain D, both of which are ohmic contacts 24. The path of the conduction channels are shown as white dashed lines through the channel layer(s) 26, which in this embodiment is a quantum well channel(s).

Those skilled in the art will recognize improvements and modifications to the preferred embodiments of the present disclosure. All such improvements and modifications are considered within the scope of the concepts disclosed herein and the claims that follow.

What is claimed is:

1. A high bandgap Schottky contact layer device, comprising:
   a substrate;
   a first Schottky contact layer over the substrate, the first Schottky contact layer comprising Aluminum Gallium Indium Phosphide (AlGaInP) and having a first bandgap;
   a second Schottky layer over the first Schottky contact layer, the second Schottky layer having a second bandgap different from the first bandgap;
   a first etched recess and a second etched recess in the second Schottky layer;
   at least one ohmic contact in the first etched recess of the second Schottky layer, a portion of which being in direct contact with the substrate; and
   a first metal contact formed in an etched recess of a passivation layer, the passivation layer formed in the second etched recess of the second Schottky layer such that the passivation layer is directly on a top surface and a sidewall of the second Schottky layer and the first metal contact forms a Schottky contact with the first Schottky contact layer;
wherein the first bandgap is greater than 1.7 electronvolts (eV) and the second bandgap is less than or equal to 1.7 eV.

2. The device of claim 1 wherein the substrate comprises Gallium Arsenide (GaAs).

3. The device of claim 1 wherein the substrate has a bandgap of less than or equal to 1.7 eV.

4. The device of claim 1 wherein the first bandgap is in a range from 1.85 eV to 2.15 eV.

5. The device of claim 1 wherein the second Schottky layer comprises at least one of: Gallium Arsenide (GaAs); and Aluminum Gallium Arsenide (AlGaAs).

6. The device of claim 1 wherein the second bandgap is less than 1.7 eV.

7. The device of claim 1 wherein the second bandgap is less than 1.7 eV.

8. The device of claim 1 wherein the first metal contact comprises at least one of: Niobium (Nb); Molybdenum (Mo); Tantalum (Ta); Tungsten (W);
Rhenium (Re); Titanium (Ti); Vanadium (V); Chromium (Cr); Zirconium (Zr); Hafnium (Hf);
Ruthenium (Ru); Rhodium (Rh); Osmium (Os); Iridium (Ir); Aluminum (Al), Platinum (Pt); and
Gold (Au).

9. The device of claim 1 wherein the first metal contact comprises an etched or diffused contact.

10. The device of claim 1 wherein the first metal contact comprises a recessed contact through the second Schottky layer.

11. The device of claim 1 wherein the first metal contact comprises a recessed contact through the second Schottky layer and into the first Schottky contact layer.

12. The device of claim 1 wherein the at least one ohmic contact comprises at least one of: a diffused contact through the first Schottky contact layer; a diffused contact through the first Schottky contact layer and the second Schottky layer; a recessed contact through the first Schottky contact layer; and a recessed contact through the first Schottky contact layer and the second Schottky layer.

13. The device of claim 1 further comprising a channel layer disposed below the first Schottky contact layer.

14. The device of claim 13 wherein the channel layer comprises a quantum well channel.

15. The device of claim 13 wherein the channel layer comprises Indium Gallium Arsenide (InGaAs).

16. The device of claim 13 comprising a first spacer layer below the channel layer and above the substrate and a second spacer layer above the channel layer and below the first Schottky contact layer.

17. The device of claim 16 wherein at least one of the first spacer layer and the second spacer layer comprises Aluminum Gallium Arsenide (AlGaAs).

18. A high bandgap Schottky contact layer device, comprising:
a substrate;
a first Schottky contact layer formed over the substrate, the first Schottky contact layer comprising Aluminum Gallium Iridium Phosphide (AlGaInP) and having a first bandgap that is greater than 1.7 electronvolts (eV);
a second Schottky layer formed over the first Schottky contact layer, the second Schottky layer having a second bandgap less than or equal to 1.7 eV;
a first metal contact formed in an etched recess of a passivation layer, the passivation layer formed in a recess of the second Schottky layer such that the passivation layer is directly on a top surface and a sidewall of the second Schottky layer, and at least a portion of the first metal contact is in direct contact with the first Schottky contact layer to form a Schottky contact; and
first and second ohmic contacts formed in separate etched recesses in the second Schottky layer, a portion of the first and second ohmic contacts being in direct contact with the substrate;
wherein the first metal contact forms a gate of an Enhancement Field-Effect Transistor (EFET), the first ohmic contact forms a source of the EFET, and the second ohmic contact forms a drain of the EFET.

19. A method for producing a high bandgap Schottky contact layer device, the method comprising:
providing a substrate;
forming, over the substrate, a first Schottky contact layer comprising Aluminum Gallium Indium Phosphide (AlGaInP) and having a first bandgap;
forming, over the first Schottky contact layer, a second Schottky layer having a second bandgap different from the first bandgap;
forming a first etched recess and a second etched recess in the second Schottky layer;
forming at least one ohmic contact in the first etched recess of the second Schottky layer, a portion of which being in direct contact with the substrate;
forming a passivation layer in the second etched recess of the second Schottky layer such that the passivation layer is directly on a top surface and a sidewall of the second Schottky layer; and
forming an etched recess in the passivation layer and forming a first metal contact in the etched recess of the passivation layer, wherein at least a portion of the first metal contact is in direct contact with the first Schottky contact layer to form a Schottky contact;
wherein the first bandgap is greater than 1.7 electronvolts (eV) and the second bandgap is less than or equal to 1.7 eV.

* * * * *

UNITED STATES PATENT AND TRADEMARK OFFICE
CERTIFICATE OF CORRECTION

PATENT NO.         : 10,720,428 B2
APPLICATION NO.    : 15/277054
DATED              : July 21, 2020
INVENTOR(S)        : Corey A. Nevers and Sheila K. Hurtt Page 1 of 1

It is certified that error appears in the above-identified patent and that said Letters Patent is hereby corrected as shown below:

In the Specification

Column 8, Lines 19-20, replace "Iridium Gallium Arsenide (InGaAs)" with --Indium Gallium Arsenide (InGaAs)--.

In the Claims

Claim 18, Column 14, Lines 5-6, replace "Aluminum Gallium Iridium Phosphide (AlGaInP)" with --Aluminum Gallium Indium Phosphide (AlGaInP)--.

Signed and Sealed this
Twenty-fifth Day of August, 2020

Andrei Iancu
*Director of the United States Patent and Trademark Office*